(12) United States Patent
Brioschi et al.

(10) Patent No.: US 11,800,297 B2
(45) Date of Patent: Oct. 24, 2023

(54) REDUCED LIGHT REFLECTION PACKAGE

(71) Applicant: INVENSENSE, INC., San Jose, CA (US)

(72) Inventors: Roberto Brioschi, Austin, TX (US); Kazunori Hayata, Cupertino, CA (US); JR-Cheng Yeh, Taoyuan (TW); Dinesh Kumar Solanki, Santa Clara, CA (US)

(73) Assignee: InvenSense, Inc., San Jose, CA (US)

( * ) Notice: Subject to any disclaimer, the term of this patent is extended or adjusted under 35 U.S.C. 154(b) by 109 days.

(21) Appl. No.: 17/494,120

(22) Filed: Oct. 5, 2021

(65) Prior Publication Data

US 2022/0191624 A1 Jun. 16, 2022

Related U.S. Application Data

(60) Provisional application No. 63/126,348, filed on Dec. 16, 2020.

(51) Int. Cl.
*H04R 19/04* (2006.01)
*B81B 7/00* (2006.01)
(Continued)

(52) U.S. Cl.
CPC ........... *H04R 19/04* (2013.01); *B81B 7/0064* (2013.01); *B81C 1/00333* (2013.01); *H04R 1/04* (2013.01);
(Continued)

(58) Field of Classification Search
CPC . H04R 19/04; H04R 1/04; H04R 3/00; H04R 2201/003; B81B 7/0064;
(Continued)

(56) References Cited

U.S. PATENT DOCUMENTS 11,117,798 B2 * 9/2021 Lorenz ................... H04R 1/023
11,209,271 B2 12/2021 Blomqvist et al.
(Continued)

FOREIGN PATENT DOCUMENTS

CN 111935623 A 11/2020
CN 112087695 A 12/2020
(Continued)

OTHER PUBLICATIONS

International Search Report and Written Opinion for International Application No. PCT/US2021/063730, dated Mar. 23, 2022.

*Primary Examiner* — Sean H Nguyen
(74) *Attorney, Agent, or Firm* — Van Hoven PC; Joshua Van Hoven

(57) ABSTRACT

A MEMS sensor includes a through hole to allow communication with an external environment, such as to send or receive acoustic signals or to be exposed to the ambient environment. In addition to the information that is being measured, light energy may also enter the environment of the sensor via the through hole, causing short-term or long-term effects on measurements or system components. A light mitigating structure is formed on or attached to a lid of the MEMS die to absorb or selectively reflect the received light in a manner that limits effects on the measurements or interest and system components.

28 Claims, 15 Drawing Sheets

(51) Int. Cl.
  *B81C 1/00* (2006.01)
  *H04R 1/04* (2006.01)
  *H04R 3/00* (2006.01)

(52) U.S. Cl.
  CPC ........ *H04R 3/00* (2013.01); *B81B 2201/0257* (2013.01); *B81B 2201/0264* (2013.01); *B81B 2201/0271* (2013.01); *B81B 2201/0292* (2013.01); *B81B 2203/0127* (2013.01); *B81B 2207/015* (2013.01); *B81C 2203/0109* (2013.01); *H04R 2201/003* (2013.01)

(58) Field of Classification Search
  CPC .... B81B 2201/0257; B81B 2201/0264; B81B 2201/0271; B81B 2201/0292; B81B 2203/0127; B81B 2207/015; B81B 7/0067; B81B 7/0061; B81C 1/00333; B81C 2203/0109
  See application file for complete search history.

(56) References Cited

U.S. PATENT DOCUMENTS

| | | | |
|---|---|---|---|
| 2016/0241953 A1* | 8/2016 | Elian | H04R 1/406 |
| 2017/0297905 A1 | 10/2017 | Saxena | |
| 2021/0405085 A1 | 12/2021 | Choi et al. | |
| 2021/0405346 A1 | 12/2021 | Giusti et al. | |
| 2021/0410340 A1 | 12/2021 | Meeusen et al. | |

FOREIGN PATENT DOCUMENTS

| | | |
|---|---|---|
| DE | 102011012295 | 8/2012 |
| WO | WO2019055437 | 3/2019 |

* cited by examiner

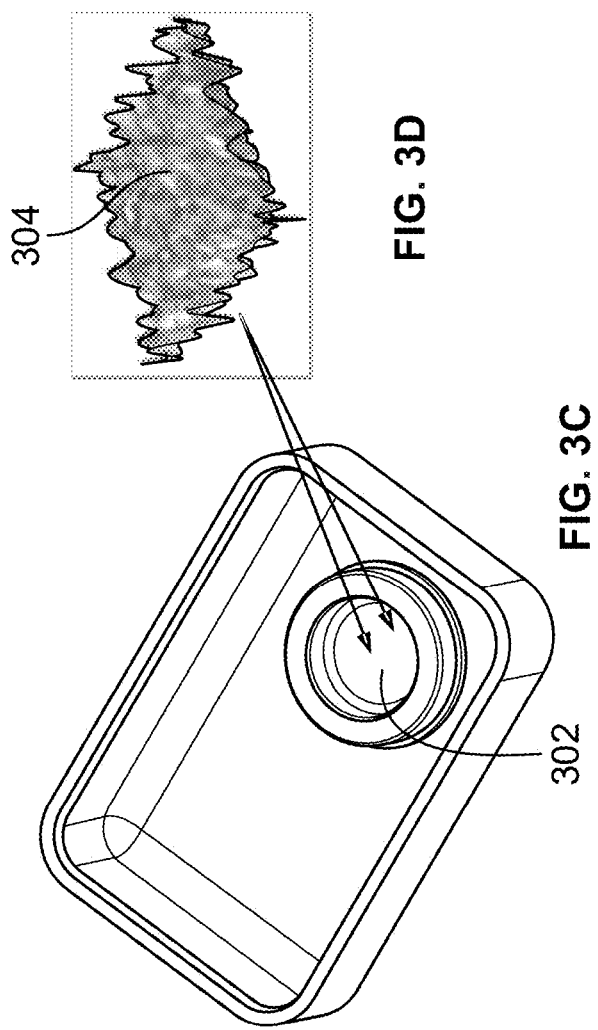

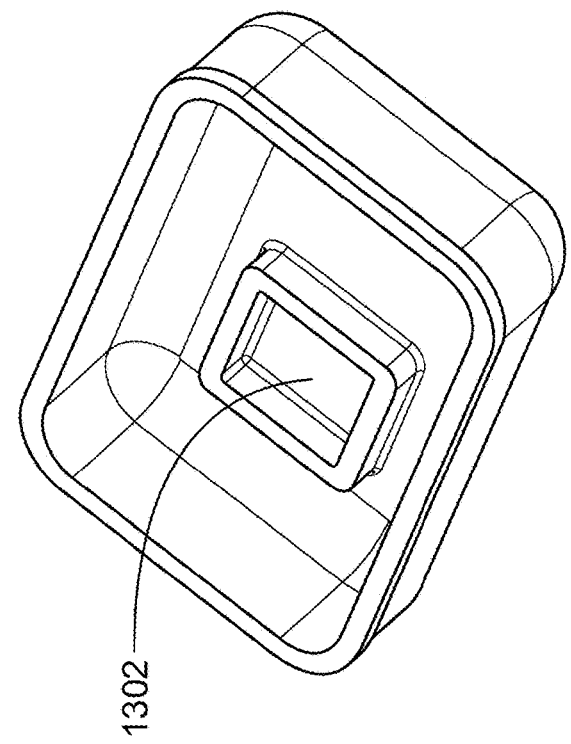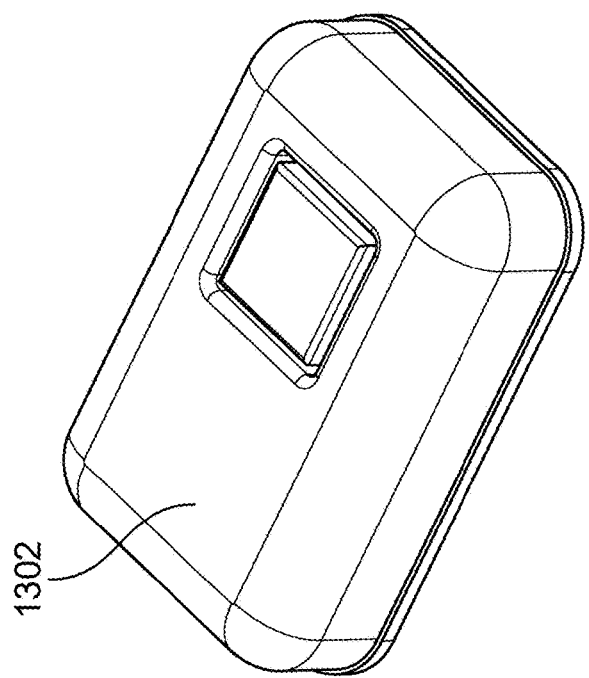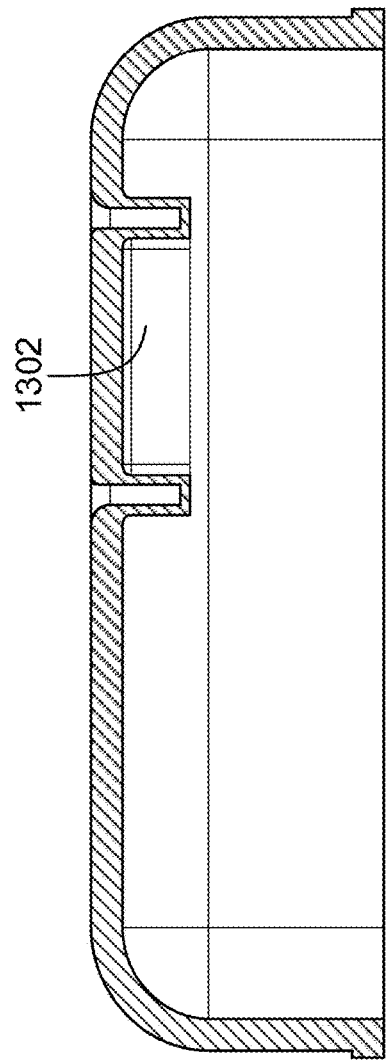
FIG. 13C
FIG. 13B
FIG. 13A

US 11,800,297 B2

REDUCED LIGHT REFLECTION PACKAGE

BACKGROUND

Mobile and smart devices are proliferating to ever more environments, enabling scores of applications such as virtual assistants, home automation, and vehicular controls. Sensors such as miniaturized microphones, time-of-flight, ultrasonic sensors, pressure sensors, and the like are able to discern information from the external environment of the sensor, such as a microelectromechanical system (MEMS) microphone that processes received acoustic information. Such sensors have proliferated to a wide variety of "smart" devices such as computers, phones, watches, locks, appliances, wireless earbuds, augmented reality systems and the like. As such applications become more commonplace, these systems are increasingly performing critical functions such as controlling access to a secured location or operating equipment.

It is therefore important that components such as MEMS sensors accurately capture and process received signals such as acoustic signals or reflected signals. Such signals are typically received via a partially exposed access port to the external environment, such as an exposed cavity that receives a signal and provides a path for the signal to be received by a movable MEMS components that respond to the incoming signal. This access port is also at least partially exposed to other aspects of the external environment. One such aspect that may impact sensor performance is light energy. Given the small size and microscopic movements of typical MEMS sensors, a light source applied to the sensor may generate electrical signals (e.g., based on energy created by the photons of the light energy) that in some instances may interfere with the electrical representation of the received signals.

SUMMARY

In an embodiment of the present disclosure, a microelectromechanical system (MEMS) sensor package comprises a substrate including a through-hole and a MEMS die comprising a movable MEMS component movable in response to a signal received via the through-hole. The MEMS sensor package may further comprise a lid coupled to the substrate and surrounding the MEMS die, wherein the lid comprises a light mitigation structure located above the movable MEMS component.

In an embodiment of the present disclosure, a microelectromechanical system (MEMS) microphone may comprise a substrate including a through-hole, a MEMS die located above the through hole and comprising a MEMS diaphragm movable in response to an acoustic signal received via the through-hole, and a lid coupled to the substrate and surrounding the MEMS die, wherein the lid comprises a light mitigation structure located above the MEMS diaphragm.

In an embodiment of the present disclosure, a method of manufacturing a light-mitigating lid for a microelectromechanical system (MEMS) sensor may comprise providing an external lid configured to couple to a substrate and define a volume of the MEMS sensor, attaching an insert to an internal surface of the external lid, the insert including a light mitigation structure, and attaching the external lid to the substrate.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 3C shows a bottom perspective view of a lid design for a MEMS sensor package in accordance with an embodiment of the present disclosure;

FIG. 3D shows an illustrative example of a cavity surface detail in accordance with an embodiment of the present disclosure;

FIG. 13A shows a top perspective view of a lid design for a MEMS sensor package in accordance with an embodiment of the present disclosure;

FIG. 13B shows a section view of a lid design for a MEMS sensor package in accordance with an embodiment of the present disclosure; and FIG. 13C shows a bottom perspective view of a lid design for a MEMS sensor package in accordance with an embodiment of the present disclosure.

DETAILED DESCRIPTION OF DRAWINGS

A MEMS sensor such as a microphone, pressure sensor, time-of-flight sensor, or ultrasonic sensor may include an access point such as a through hole or port to provide access to the external environment, for example, to receive an acoustic signal at a microphone. Such an access point may also provide a path for light energy to enter the sensor and propagate within the sensor, such as through an internal volume of the sensor. Such propagation of light energy may impact performance in the short run by photons adding energy to processing circuitry of the sensor, resulting in changes in measured values. Over time, light energy may cause components to degrade or fall out of spec.

The MEMS sensor may include a light mitigating structure located such as on a lid of the MEMS sensor, which may substantially permit received light energy from impacting either short-term or long-term sensor performance. Proximate to a location where the light energy is received, for example, above the access point for the sensor, the light mitigating structure may encounter substantially all of the received light energy. The light mitigating structure may absorb light energy, such as by surface roughening or insertion of a light-absorbing insert. In some embodiments, portions of the light mitigating structure may be reflective, such as to direct light away from sensitive components or in the direction of light-absorbing portions of the light mitigating structure.

Figure 1:
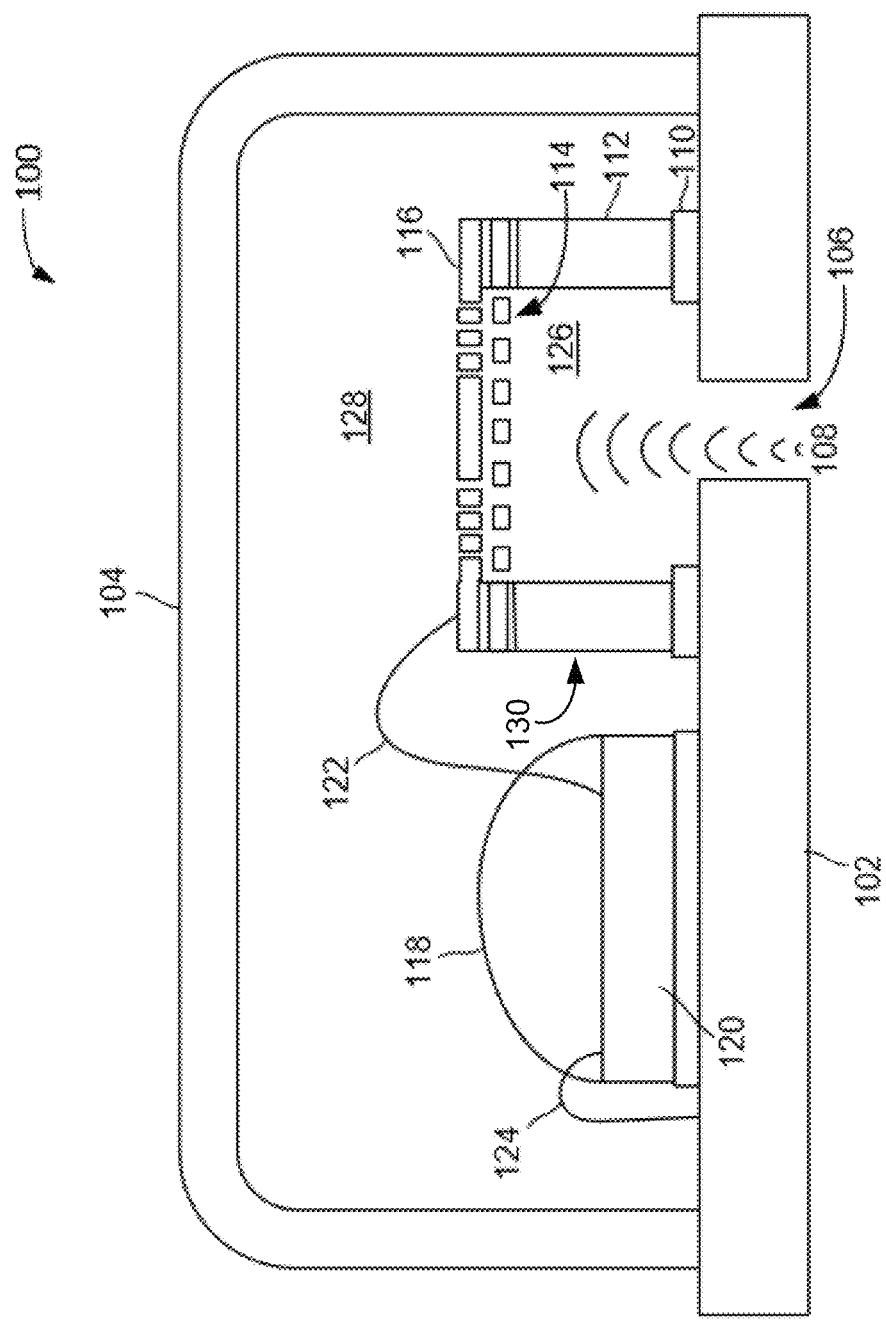
FIG. 1 shows an illustrative MEMS sensor package in accordance with an embodiment of the present disclosure.

FIG. 1 shows an illustrative MEMS sensor package in accordance with an embodiment of the present disclosure. In the depicted embodiment, the sensor package has a particular configuration, including the number and location of a MEMS die and through-hole, MEMS diaphragm and back plate design, configuration of front and back volumes, lid, glob top, and processing circuitry type and location. It will be understood that the present invention is applicable to any suitable sensor type and configuration, including modifications to any of the above or other features such as multiple MEMS die, different front and back volume designs, varied locations and types of processing circuitry, and additional circuitry such as additional processing circuitry (e.g., a host processor coupled to the processing circuitry of the MEMS sensor package).

An exemplary MEMS sensor package 100 includes a lid 104 affixed to a substrate 102, which collectively define an internal volume of the MEMS sensor package 100 in which a MEMS die 130 includes a MEMS handle 112, MEMS diaphragm 114, and back plate 116 is disposed on substrate 102. The internal volume of MEMS sensor package 100 includes a front volume 126 and a back volume 128. Although not depicted in the section view of FIG. 1, the lid 104 and the substrate 102 may be generally square or rectangular, while a through-hole 106 extending through substrate 102 to front volume 126 may be generally circular.

The internal cavity that defines the front volume 126, which is designed to have appropriate properties for receiving and propagating an acoustic signal 108 that is received via the through-hole 106. The MEMS diaphragm 114 is located at a location of the MEMS handle 112 opposite the through-hole 106, such that acoustical energy of the acoustic signal 108 within front volume 126 propagates to the MEMS diaphragm 114. The MEMS diaphragm 114 is fabricated as a relatively thin layer of material, is suspended, and has a shape that collectively facilitates movement of the MEMS diaphragm 114 in response to the acoustic signal 108. Back plate 116 is located parallel to MEMS diaphragm 114 and is fabricated as a relatively thick layer of material that does not appreciably move in response to the received acoustic signal 108. Back plate 116 also includes equalizations channels that allow pressure to equalize between the front volume 126 and the back volume 128. In some embodiments (not depicted), back plate 116 is positioned such that the acoustic signal 108 first contacts the back plate 116 before contacting the MEMS diaphragm 114. Collectively, the design and configuration of the MEMS diaphragm 114, back plate 116, front volume 126, and back volume 128 influence the response of the MEMS diaphragm 114 to the acoustic signal 108.

The MEMS diaphragm 114 and back plate 116 are each at a respective potential (e.g., based on electrical connections to processing circuitry (e.g., ASIC 120) via substrate 102, not depicted) such that a capacitance is formed between the MEMS diaphragm 114 and back plate 116. The MEMS diaphragm 114 moves relative to the back plate 116 based on the received acoustic signal 108, resulting in a change in capacitance between the MEMS diaphragm 114 and back plate 116 that is representative of the received acoustic signal 108. The sensed capacitance is provided to processing circuitry (e.g., ASIC 120) via a first wire 122.

Although processing circuitry (e.g., ASIC 120) may be located in a variety of locations, such as within substrate 102 or lid 104 of MEMS sensor package 100 or external to MEMS sensor package 100, as depicted in FIG. 1 the processing circuitry (e.g., ASIC 120) is affixed to substrate 102 via glue 110 within the back volume 128. It will be understood that any suitable adhesive may be used for glue 110. The processing circuitry (e.g., ASIC 120) may include one or more components providing necessary processing based on the requirements of the MEMS sensor package 100. In some embodiments, processing circuitry (e.g., ASIC 120) may be an ASIC specifically designed and/or programmed for microphone processing. In some embodiments, processing circuitry (e.g., ASIC 120) may include one or more registers that allow aspects of the operation of hardware control logic of the ASIC to be modified (e.g., by modifying a value of a register). In some embodiments, processing circuitry (e.g., ASIC 120) may also include a processor such as a microprocessor that executes software instructions, e.g., that are stored in a local memory (not depicted). The microprocessor may control the operation of the MEMS sensor interacting with the hardware control logic.

Glob top 118 may be formed around processing circuitry (e.g., ASIC 120) to protect the processing circuitry (e.g., ASIC 120) from light, humidity, and other external, environmental hazards, limit electro-magnetic interference, and the like. For example, encapsulant resin may compose glob top 118 to protect processing circuitry (e.g., ASIC 120). In some embodiments, glob top 118 may limit extra current draw due to light exposure. Glob top 118 may result in back volume 128 variation or reduction, which impacts the design of MEMS handle 112 and processing circuitry (e.g., defines maximum size of ASIC 120). The processing circuitry (e.g., ASIC 120) performs a variety of functions such as control of MEMS operational parameters, microphone signal processing (e.g., amplification, tuning, filtering, analog-to-digital conversion, and compensation), communication with external components and/or processing (e.g., with a host processor via a second wire 124), self-test and calibration (e.g., based on received light signals, as described herein), and low-power controls. A signal received at processing circuitry (e.g., ASIC 120) via the first wire 122 corresponds to a change in capacitance between the MEMS diaphragm 114 and back plate 116, which in turn corresponds to the received acoustic signal 108. That received signal is then processed by the processing circuitry (e.g., ASIC 120) to generate a microphone signal (e.g., a digital representation of the received capacitance) which may be provided to external components for further processing and/or processed further by the processing circuitry (e.g., to remove effects of a light signal on the microphone signal, as described herein).

Figure 2:
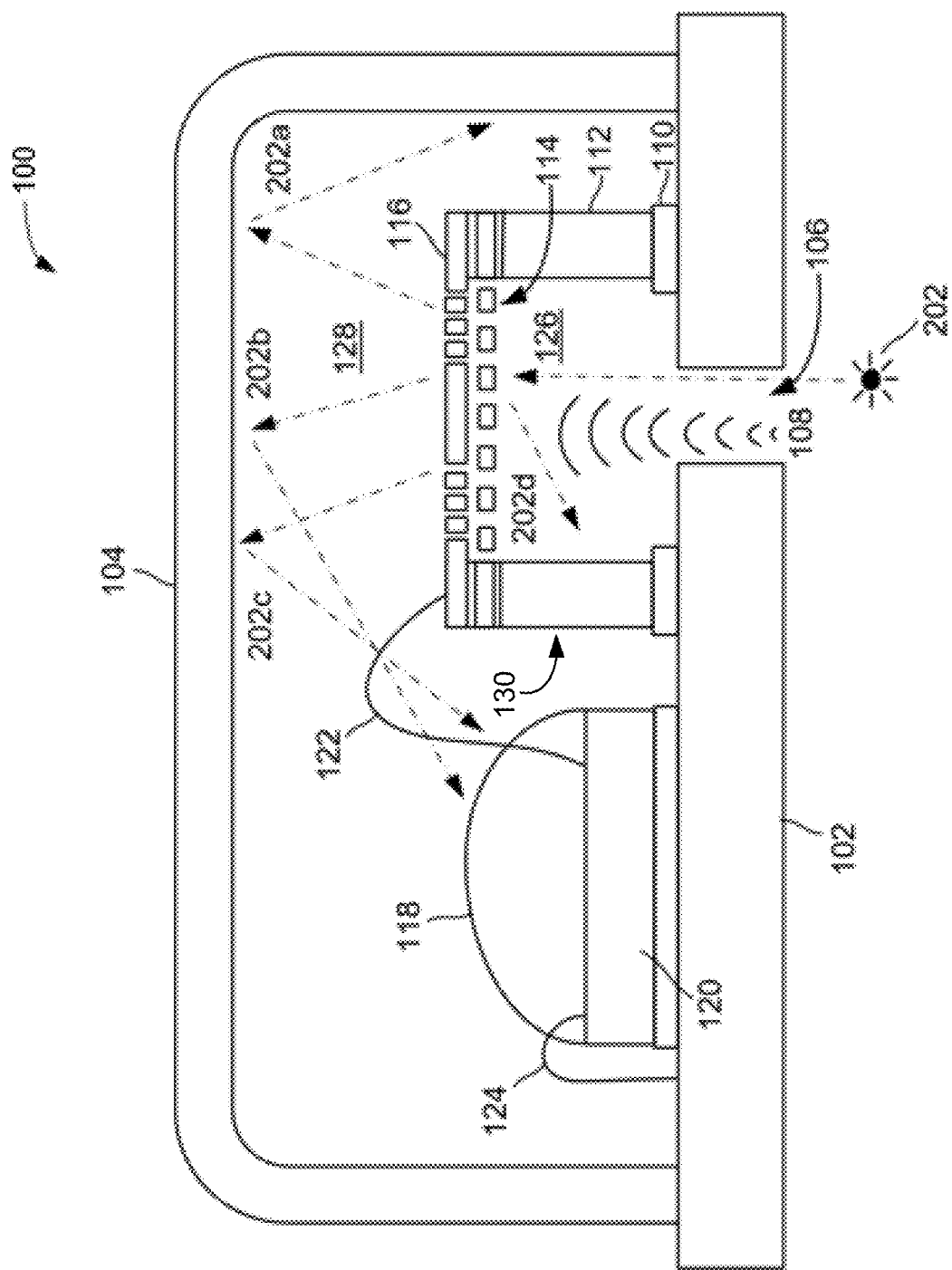
FIG. 2 shows an illustrative MEMS sensor package receiving light interference in accordance with an embodiment of the present disclosure.

FIG. 2 shows an illustrative MEMS sensor package receiving light interference in accordance with an embodiment of the present disclosure. The components of the MEMS sensor package 100 of FIG. 1 are depicted in FIG. 2, except that a light interference source 202 transmits light energy through the through-hole 106 into the front volume 126 of the MEMS sensor package 100.

A variety of light interference sources 202 may transmit light energy to the MEMS sensor package 100, including to the exterior of the MEMS sensor package 100 (e.g., substrate 102 or a surface connected or adjacent to substrate 102) and/or the interior of MEMS sensor package 100 (e.g., via through-hole 106 into front volume 126, or in embodiments with additional through-holes such as to a back volume, through any such passage into an internal volume of the sensor). Light interference sources 202 can be provided from natural sources (e.g., sunlight, moonlight, fire, etc.), artificial sources under normal operation (e.g., indoor lighting, outdoor lighting, vehicle headlights, screens, signs, etc.), and targeted sources (e.g., lasers, directed light energy, etc.), and combinations thereof. If a user is relatively stationary, the light interference source 202 may increase MEMS sensor noise over time, such as by increasing the temperature of the MEMS component and/or processing circuitry. Another exemplary light interference source 202 is changes in light reception while a user of the MEMS sensor is moving. For example, a user may be speaking into a microphone while walking, biking, driving, or on public transportation. The user may move between light sources such as by moving between rooms from an indoor to an outdoor environment, or may pass by objects such as trees, buildings, vehicle lights, and signs that temporarily change or obstruct light reaching the MEMS sensor. Such time-varying changes in ambient light irradiation of the MEMS sensor may cause an audible noise at the output of the microphone. Abrupt changes in light energy received by the MEMS sensor may abruptly change the noise level to a degree that a received acoustic signal may be obscured. An example of a targeted source is a laser or similar directed light device. Such sources can be electronically controlled to change intensity, wavelength, and other properties at high frequencies, including at frequencies typically associated with acoustic signals to mimic valid or expected user inputs. In this manner, targeted sources can interfere with actual speech and/or be used to mimic speech or voice commands.

The light interference source 202 of FIG. 2 is depicted as a targeted light source and will be depicted and described as having a particular propagation pattern. It will be understood that while other light interference sources 202 (not depicted) may be received in a different manner (e.g., as dispersed sunlight or artificial light rather than a concentrated targeted light source), such light sources will also propagate within the front volume 126, MEMS handle 112, and back volume 128 as the light energy of the light interference source 202 reflects off of surfaces of the MEMS sensor package 100. Accordingly, the particular light interference source 202 propagation, depicted in FIG. 2, into light interference 202*a*, 202*b*, 202*c*, and 202*d* is exemplary only. In the exemplary embodiment of FIG. 2, light energy from the light interference source 202 hits the surface of the MEMS die 130 (e.g., MEMS handle 112, MEMS diaphragm 114 and/or other surfaces defining the front volume 126), with some of the light energy being absorbed by the components of the MEMS die 130 while some of the light energy is reflected (e.g., as light interference 202*d*) within the front volume 126, until all of the light energy is either transmitted away from the front volume 126 (e.g., through to the back volume 128 and/or back out of the through-hole 106). Some of the light energy from light interference source 202 may also propagate through the MEMS die 130 and equalization channels of the back plate 116 to the back volume 128. The light interference 202*a*-202*c* may continue to propagate within the back volume 128, including reflecting off lid 104, particularly with a reflective lid material such as a metal (e.g., aluminum). At least some of the light energy from the light interference source 202 may propagate within the back volume 128 to the glob top 118 (e.g., as light interference 202*a*-202*c*). In the absence of the glob top 118, the propagated light would contact the ASIC 120, creating both short-term effects (e.g., creating heat which impacts measured values based on changes to operation of electrical components of the ASIC 120) and long-term effects (e.g., creating corrosion that increases the potential for failure and impacts electrical components and thus long-term accuracy). The glob top 118, while providing protection from such short-term and long-term effects, requires extra processing steps for manufacture and is difficult to control as far as volume and accuracy of application, resulting in inconsistent changes to back volume that affects performance.

Figure 3B:
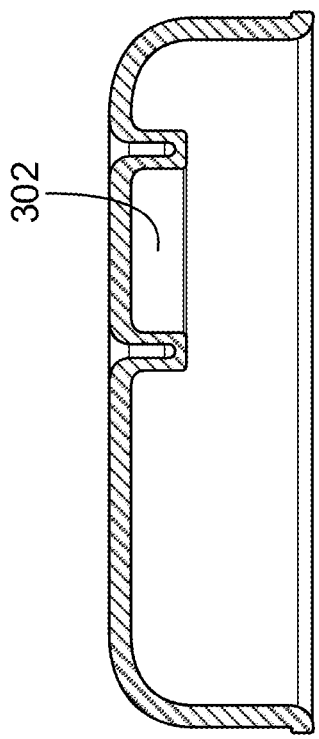
FIG. 3B shows a section view of a lid design for a MEMS sensor package in accordance with an embodiment of the present disclosure.
Figure 3A:
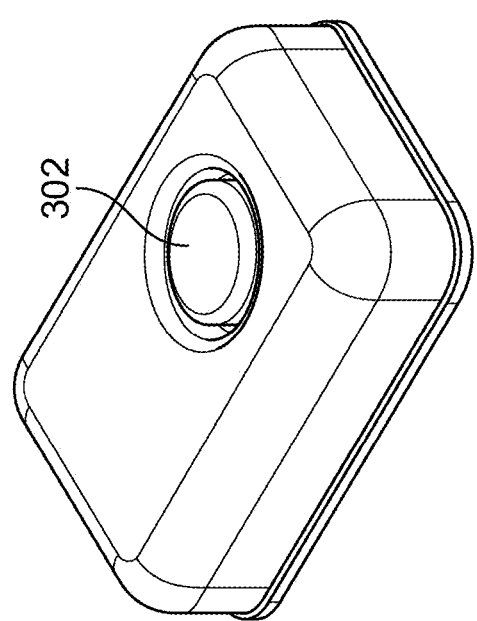
FIG. 3A shows a top perspective view of a lid design for a MEMS sensor package in accordance with an embodiment of the present disclosure.

FIG. 3A shows a top perspective view of a lid design for a MEMS sensor package in accordance with an embodiment of the present disclosure. In the depicted embodiment, a light mitigation structure of a cylindrical shape has been embedded in a lid to prevent light interference from propagating throughout a back volume and to processing circuitry (e.g., an ASIC 120). It will be understood that the light mitigation structure may be any suitable shape for mitigating light interference (e.g., square, rectangular, hexagonal, octagonal, oval, etc.), for example, based on the respective lid shape, location of light entry locations, and locations of impacted components (e.g., ASIC 120). In some embodiments, a light mitigation structure may include multiple adjacent or dispersed protrusions from the lid into the back volume as appropriate. Although a variety of processes may be used to create the protrusion on the lid depending on underlying materials and manufacturing processes for the lid (e.g., casting, molding, stamping, assembly, etc.), in an embodiment the light mitigation structure is created with a deep drawing manufacturing process by modifying a stamping tool, including a light internal roughness definition. As described herein, the shape of the light mitigation structure is selected to absorb/capture light energy and/or deflect light energy away from sensitive components. In addition, the light mitigation structure includes a cavity surface detail (e.g., applied surface roughness, cave roughness) that is embedded in the upper surface of the lid and absorbs light interference that makes contact with the upper surface. In some embodiments, the cavity surface detail (e.g., applied surface roughness, cave roughness) may vary based on the stamping tool used to embed the lid to create the light mitigation structure.

An exemplary light mitigation structure 302 is embedded in the upper surface of lid 104, including one or more features that extend from the upper surface of lid 104 in the direction of the MEMS diaphragm 114 and back plate 116. The light mitigation structure 302 also contributes to defining back volume 128. In some embodiments, light mitigation structure 302 includes a cavity surface detail on the internal upper surface of lid 104, which has a surface area that's greater than the MEMS diaphragm 114 surface area such that the cavity surface detail surrounds a projection of the MEMS diaphragm 114 surface area. In this manner, light that propagates through the MEMS diaphragm 114 and back plate 116, even as it is dispersed at an angle from the back plate 116 within the back volume 128, will propagate to the light mitigation structure 302. Further, the cavity surface detail may incorporate roughening applied on the inner surfaces of the light mitigation structure 302 (not depicted in FIGS. 3A and 3B) to absorb light interference 202a-202c. In some embodiments, the cavity surface detail may incorporate one or more reflective surfaces to mitigate light interference 202a-202c by directing light energy received via the MEMS diaphragm 114 away from processing circuitry (e.g., ASIC 120). In some embodiments, the cavity surface detail may incorporate a light absorbing insert or material to absorb light interference 202a-202c. Features such as surface roughening, reflective surfaces, and inserts may also be combined based on the particular design, for example, with a light absorbing upper inner surface of the light mitigation structure 302 and reflective side surfaces that direct light energy towards the upper inner surface.

FIG. 3B shows a section view of a lid design for a MEMS sensor package in accordance with an embodiment of the present disclosure. The exemplary lid design, including light mitigation structure 302, is depicted in FIG. 3B at a section view but includes all the components and characteristics described above for FIG. 3A. As is depicted in FIG. 3B, the light mitigation structure 302 extends within the back volume defined by the lid, creating a portion of that volume that functions to absorb and/or redirect light energy.

FIG. 3C shows a bottom perspective view of a lid design for a MEMS sensor package in accordance with an embodiment of the present disclosure. The exemplary lid design, including light mitigation structure 302, is depicted in FIG. 3C at a bottom view but includes all the components and characteristics described above for FIG. 3A. As is depicted in FIG. 3C, the light mitigation structure 302 extends within the back volume defined by the lid, creating a portion of that volume that functions to absorb and/or redirect light energy. FIG. 3D shows an illustrative example of cavity surface detail in accordance with an embodiment of the present disclosure. In the depicted embodiment, arrows indicate that cavity surface detail 304 (e.g., applied surface roughness, cave roughness) is located on the upper inside surface of lid 104 within light mitigation structure 302. The cavity surface detail 304 is applied such as by a deep drawing manufacturing process by modifying a stamping tool, including a light cave roughness definition. According to the cave roughness of the stamping tool, a suitable roughness for absorbing light interference 202a-202c via MEMS diaphragm 114 may be used for cavity surface detail 304. In some embodiments, cavity surface detail 304 may be extended to the entire internal cavity of lid 104. For surface roughening techniques that are directly applied to the inside surface of the lid, or manufacturing techniques which allow the lid to be initially shaped with an applied surface roughness (e.g., casting, molding, etc.), additional portions of the inside (e.g., back volume facing) surfaces of the lid may have applied surface roughness, further mitigating the transmission of light that is not absorbed and/or redirected by the light mitigation structure 302.

Figure 4:
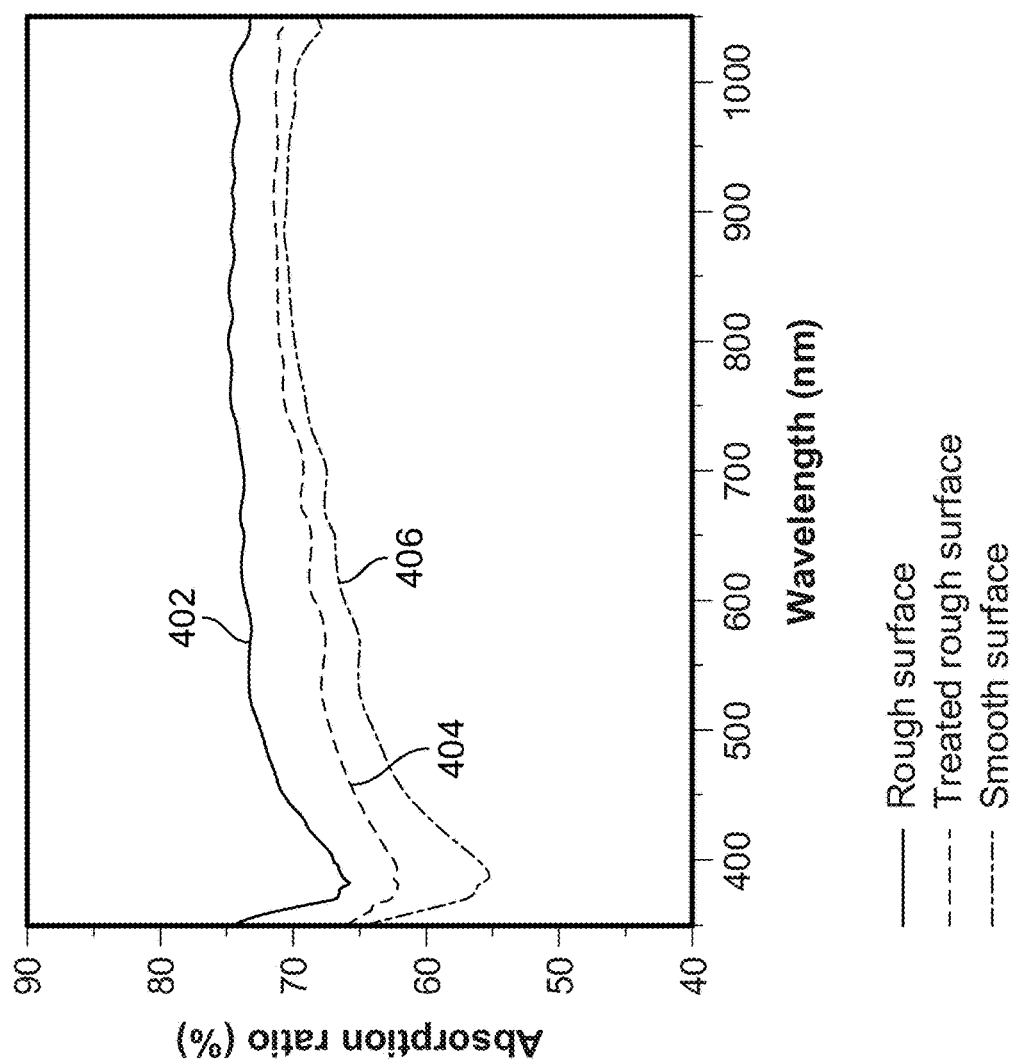
FIG. 4 shows an example diagram depicting an absorption ratio percentage as a function of wavelength of received light interference in accordance with an embodiment of the present disclosure.

FIG. 4 shows an example diagram depicting absorption ratio percentage as a function of wavelength of received light interference in accordance with an embodiment of the present disclosure. FIG. 4 shows an example graph of Absorption ratio (%) versus Wavelength (nm) that depicts an absorption ratio percentage of light interference 202a-202c for the cavity surface detail 304 of three types: rough surface, treated rough surface, and smooth surface. Although FIG. 4 depicts three types of cavity surface detail 304, it will be understood that other suitable cavity surface detail 304 may be implemented in the present disclosure. In some embodiments, cavity surface detail 304 may incorporate a light absorbing insert to mitigate light interference 202a-202c. In further embodiments, cavity surface detail 304 may incorporate a reflective surface to redirect light interference 202a-202c.

The depicted embodiment presents three examples in which cavity surface detail 304 (e.g., applied surface roughness, cave roughness) meets a maximum roughness threshold (e.g., rough surface 402), a medium roughness threshold (e.g., treated rough surface 404), and a minimum roughness threshold (e.g., smooth surface 406), each of which correspond to an absorption ratio percentage as a function of the wavelength of received light interference 202a-202c. For example, light interference 202a-202c with a wavelength of approximately 400 nanometers results in an absorption ratio percentage of about 67% for rough surface 402, 63% for treated rough surface 404, and 56% for smooth surface 406. At a wavelength of approximately 900 nanometers, the absorption ratio percentage collectively raises to about 75% for rough surface 402, 72% for treated rough surface 404, and 71% for smooth surface 406.

Figure 5:
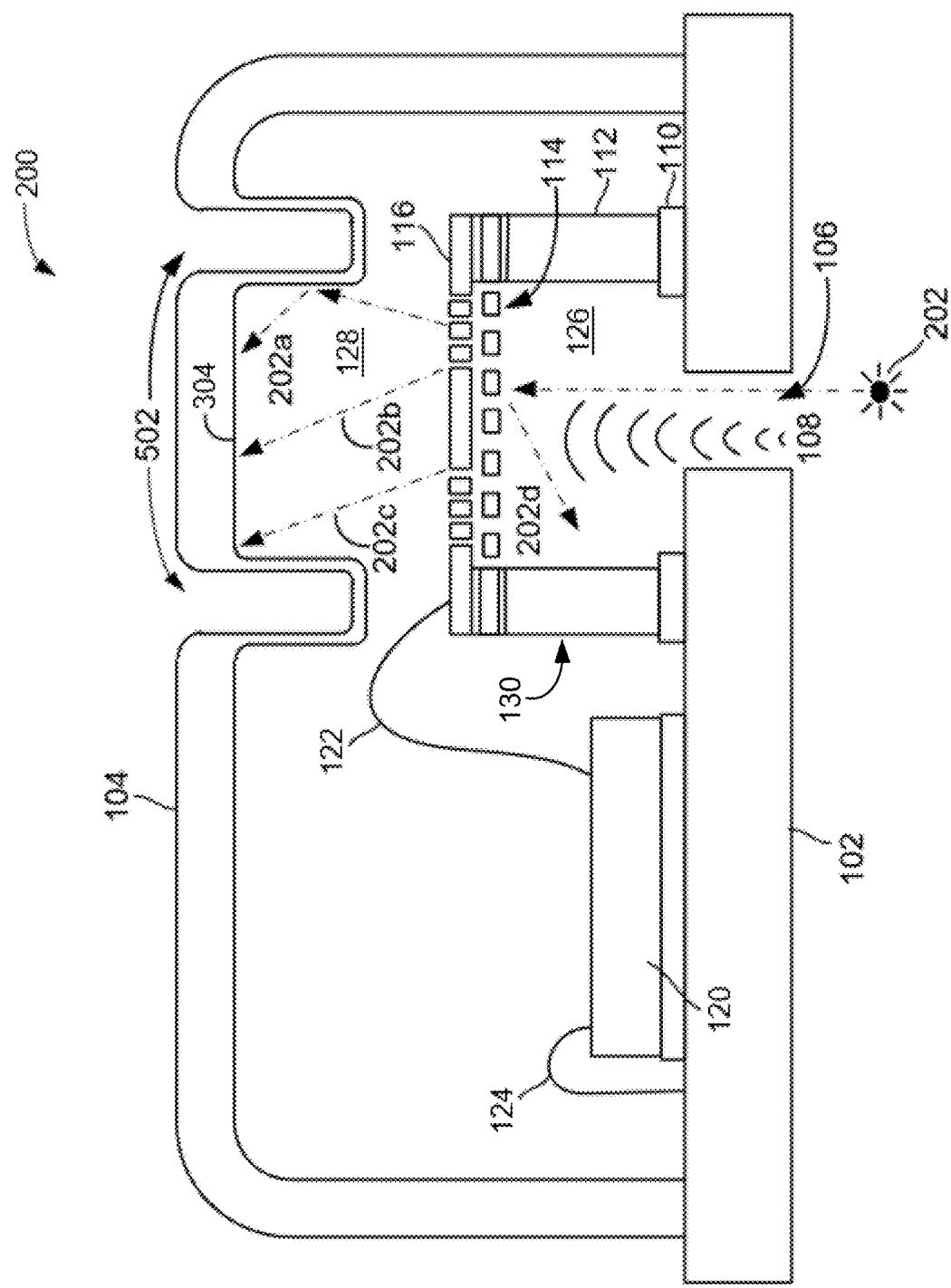
FIG. 5 shows an illustrative MEMS sensor package with a light mitigation structure receiving light interference in accordance with an embodiment of the present disclosure.

FIG. 5 shows an illustrative MEMS sensor package with a light mitigation structure receiving light interference in accordance with an embodiment of the present disclosure. The components of the MEMS sensor package 100 of FIG. 2 are depicted in MEMS sensor package 200 of FIG. 5, except that glob top 118 has been removed, light mitigation structure 502 (corresponding to light mitigation structure 302) receives light interference 202a-202c, and cavity surface detail 304 (e.g., applied surface roughness, cave roughness) absorbs light interference 202a-202c.

An exemplary light mitigation structure 502 is embedded in the upper surface of lid 104, including one or more features that extend from the upper surface of lid 104 in the direction of the MEMS diaphragm 114 and back plate 116. The light mitigation structure 502 also contributes to defining back volume 128. In some embodiments, light mitigation structure 502 includes a cavity surface detail 304 (e.g., applied surface roughness, cave roughness) on the upper inside surface of lid 104, which has a surface area that's greater than the MEMS diaphragm 114 surface area such that the cavity surface detail 304 (e.g., applied surface roughness, cave roughness) surrounds a projection of the MEMS diaphragm 114 surface area. In the embodiment depicted in FIG. 5, the cavity surface detail 304 (e.g., applied surface roughness, cave roughness) incorporates applied surface roughening to absorb light interference 202a-202c. In some embodiments, the cavity surface detail 304 or portions thereof may incorporate a reflective surface to mitigate light interference 202a-202c by directing light energy received via the MEMS diaphragm 114 away from processing circuitry (e.g., ASIC 120). In some embodiments, the cavity surface detail 304 may incorporate a light absorbing insert (not depicted in FIG. 5) to absorb light interference 202a-202c. In some embodiments, light mitigation structure 502 may be designed in other suitable shapes (e.g., cylindrical, rectangular, etc.) to mitigate light interference 202a-202c. In further embodiments, light mitigation structure 502 may be designed with an open port hole to allow light interference 202a-202c to escape.

Figure 6B:
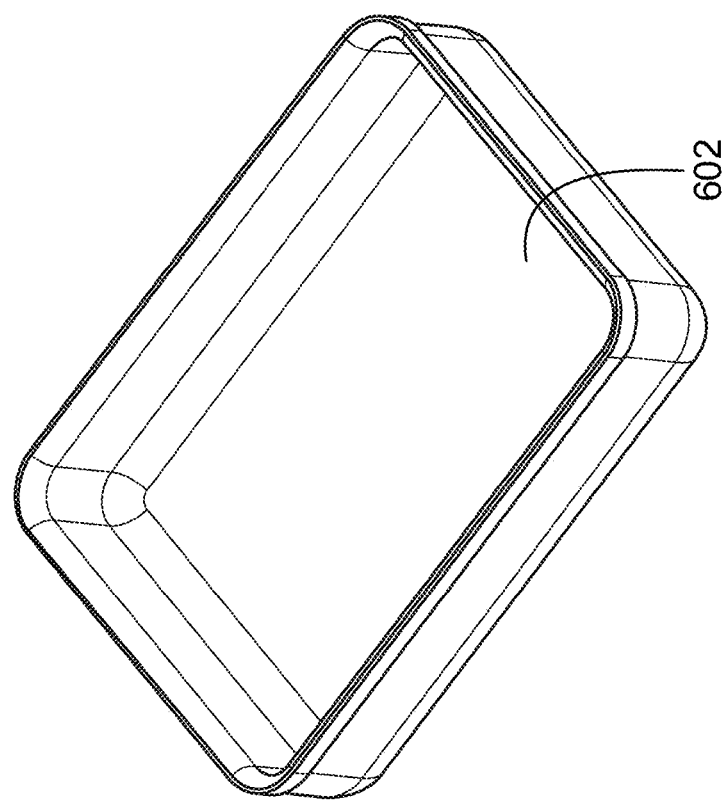
FIG. 6B shows a bottom perspective view of an external lid design for a MEMS sensor package in accordance with an embodiment of the present disclosure.
Figure 6A:
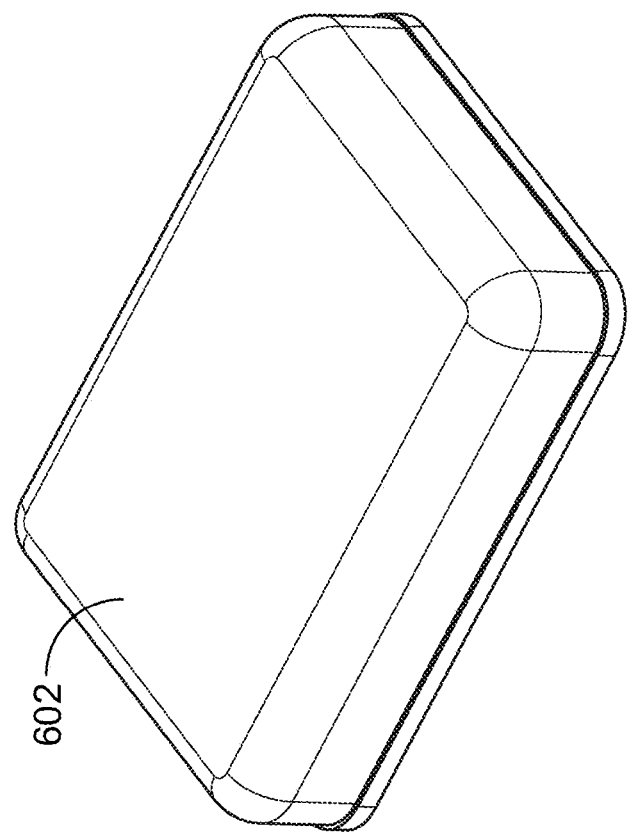
FIG. 6A shows a top perspective view of an external lid design for a MEMS sensor package in accordance with an embodiment of the present disclosure.
Figure 7B:
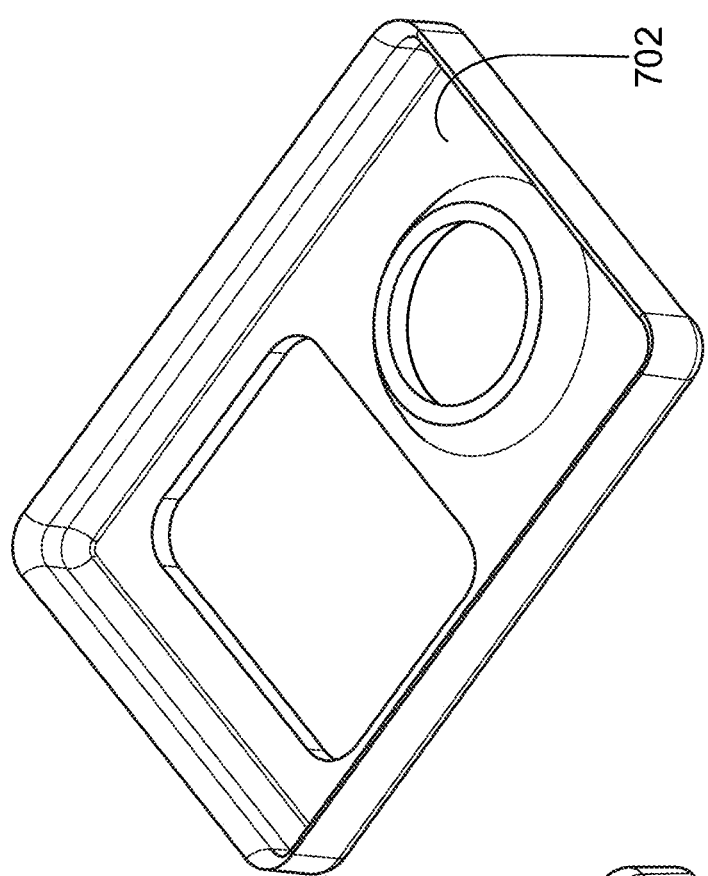
FIG. 7B shows a bottom perspective view of an internal lid insert design for a MEMS sensor package in accordance with an embodiment of the present disclosure.
Figure 7A:
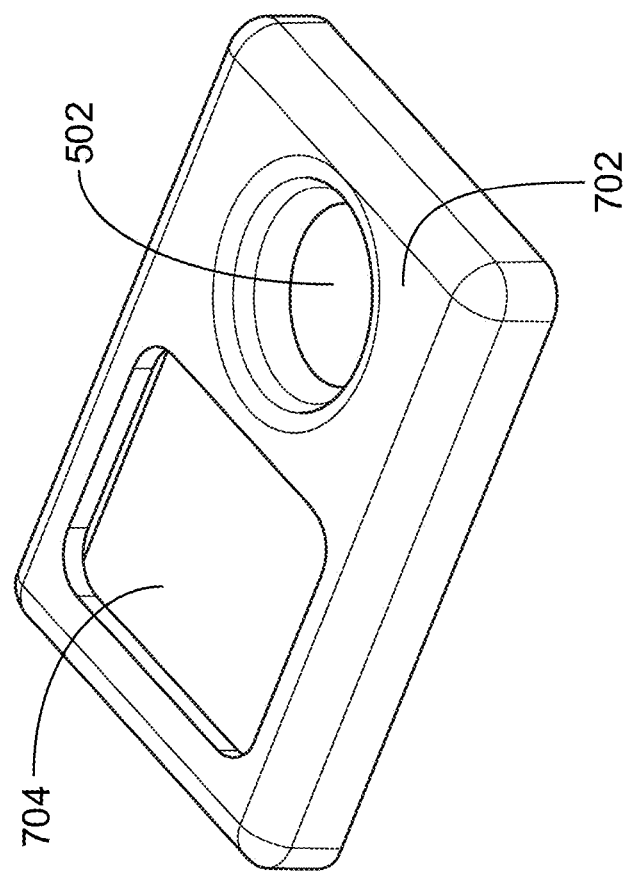
FIG. 7A shows a top perspective view of an internal lid insert design for a MEMS sensor package in accordance with an embodiment of the present disclosure.

FIG. 6A shows a top perspective view of an external lid design for a MEMS sensor package in accordance with an embodiment of the present disclosure, while FIG. 6B shows a bottom perspective view of an external lid design for a MEMS sensor package in accordance with an embodiment of the present disclosure. In the depicted embodiment, external lid 602 encapsulates an internal lid insert, shown in FIG. 7A and FIG. 7B, to collectively create a light mitigation structure within a typical lid (e.g. without an integral light mitigation structure). External lid 602 contributes to defining a back volume, which impacts acoustic performance (e.g., sensitivity and frequency response). External lid 602 couples to a substrate of the sensor and surrounds components of the MEMS sensor package (e.g., an ASIC, MEMS die, etc.), protecting the MEMS sensor components from external hazards (e.g., air, humidity, light, etc.), including RF interference. In some embodiments, external lid 602 may include processing circuitry and may connect to external circuitry. In some embodiments, eternal lid 602 includes an internal cavity surface detail (e.g., applied surface roughness, cave roughness) at least on portions of the lid 602 internal surface that may contact and absorb received light when the insert of FIGS. 7A and 7B is inserted. In some embodiments, the cavity surface detail or a portion thereof may incorporate a reflective surface to mitigate light interference by directing light energy received via the MEMS diaphragm away from processing circuitry (e.g., the ASIC).

FIG. 7A shows a top perspective view of an internal lid insert design for a MEMS sensor package in accordance with an embodiment of the present disclosure, while FIG. 7B shows a bottom perspective view of an internal lid insert design for a MEMS sensor package in accordance with an embodiment of the present disclosure. In the depicted embodiment, internal lid insert 702 is enclosed by external lid 602 depicted in FIG. 6A and FIG. 6B. Internal lid insert 702 contributes to defining back volume 128, which impacts acoustic performance (e.g., sensitivity and frequency response). Internal lid insert 702 couples to external lid 602 (e.g., by adhesive) and surrounds components of the MEMS sensor package 200 (e.g., ASIC, MEMS die, etc.). Although internal lid insert 702 may be a variety of materials having desired properties (e.g., light absorbing, reflective, etc.), or a combination of materials, in an embodiment the insert may be a light absorbing polymer. In the depicted embodiment, light mitigation structure 502 of a cylindrical shape has been embedded in internal lid insert 702 to prevent light interference from propagating throughout the back volume and impacting or damaging processing circuitry (e.g., ASIC). It will be understood that light mitigation structure 502 may be any suitable shape (e.g., cylindrical, rectangular, etc.) for mitigating light interference. Light mitigation structure 502 includes one or more features that extend from the upper surface of internal lid insert 702 in the direction of the MEMS diaphragm and back plate. Internal lid insert 702 also includes recess 704 which increases back volume, impacting acoustic performance (e.g., sensitivity and frequency response).

Figure 8C:
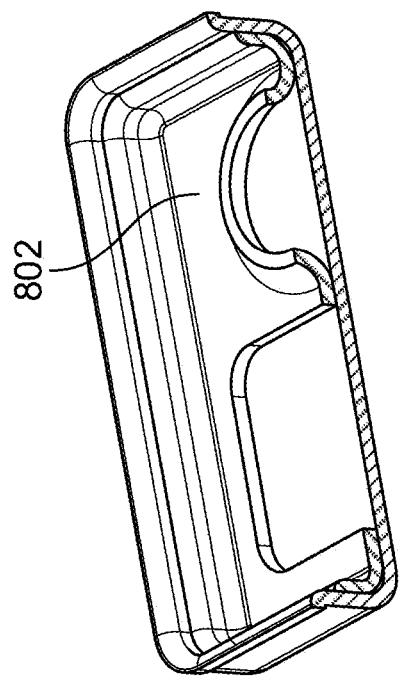
FIG. 8C shows a bottom perspective section view of a final lid assembly for a MEMS sensor package in accordance with an embodiment of the present disclosure.
Figure 8B:
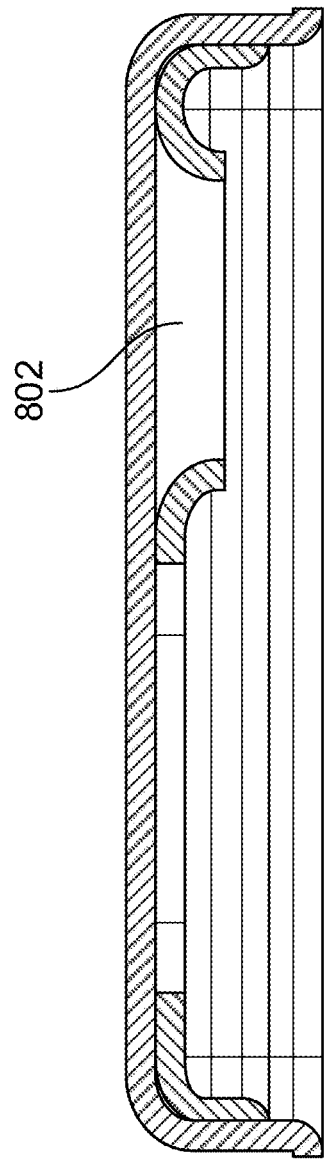
FIG. 8B shows a section view of a final lid assembly for a MEMS sensor package in accordance with an embodiment of the present disclosure.
Figure 8A:
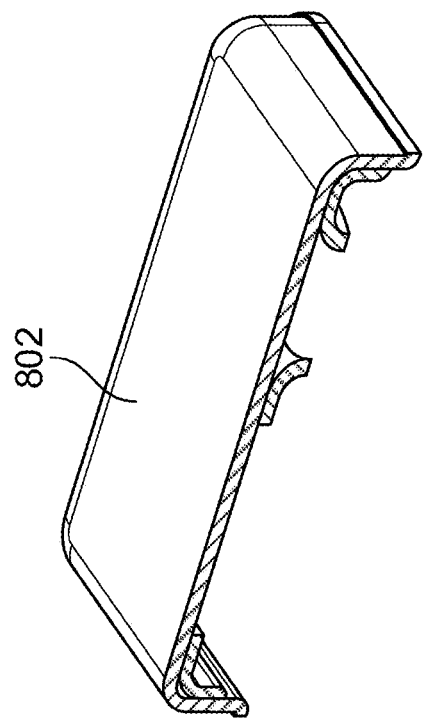
FIG. 8A shows a top perspective section view of a final lid assembly for a MEMS sensor package in accordance with an embodiment of the present disclosure.

FIG. 8A shows a top perspective section view of a final lid assembly for a MEMS sensor package in accordance with an embodiment of the present disclosure, FIG. 8B shows a section view of a final lid assembly for a MEMS sensor package in accordance with an embodiment of the present disclosure, and FIG. 8C shows a bottom perspective section view of a final lid assembly for a MEMS sensor package in accordance with an embodiment of the present disclosure. In the depicted embodiment, final lid assembly 802 includes external lid 602 and internal lid insert 702 attached together. Final lid assembly 802 defines a back volume and also includes a light mitigation structure. Final lid assembly 802 couples to a substrate and surrounds components of the MEMS sensor package (e.g., ASIC, MEMS die, etc.), protecting them from external hazards (e.g., air, humidity, light, etc.), including RF interference.

Figure 9A:
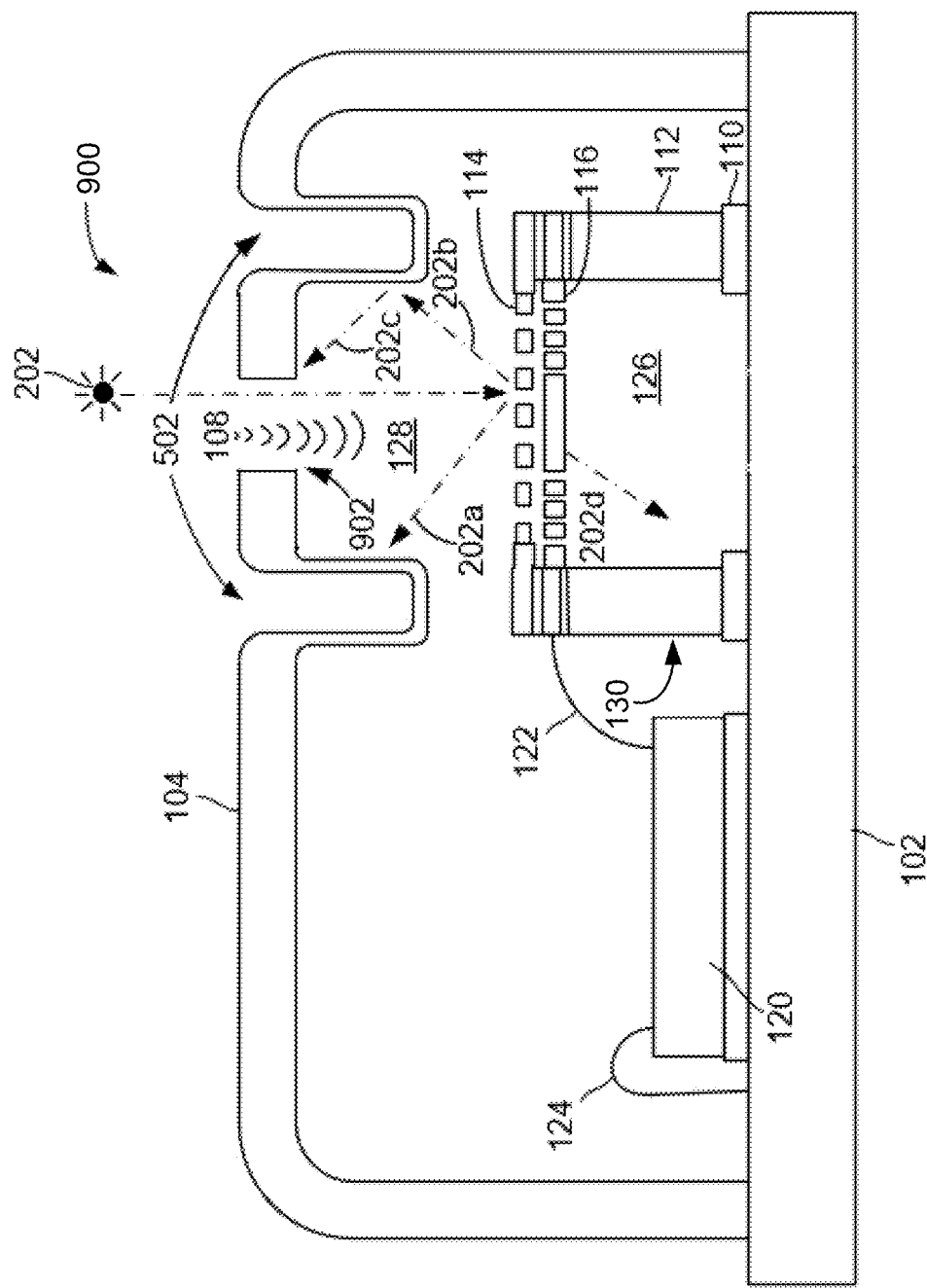
FIG. 9A shows an illustrative MEMS microphone package with a top port hole in accordance with an embodiment of the present disclosure.

FIG. 9A shows an illustrative MEMS microphone package with a top port hole in accordance with an embodiment of the present disclosure. The MEMS sensor package 900 includes a top port hole 902 positioned on the upper surface of light mitigation structure 502 that allows an acoustic signal or other environment of interest (e.g., pressure, acoustic, ultrasonic, etc.) to be provided to MEMS within the sensor package. At the same time, the top port hole 902 provides an opening within lid 104 for light interference 202a-202c to enter the MEMS sensor. In some embodiments, port hole 902 may be any suitable shape (e.g., circular, rectangular, etc.) to expose MEMS components (e.g., a MEMS diaphragm 114 of a top port hole microphone) to an outside environment of interest (e.g., for the microphone of FIG. 9A, an acoustic signal 108), while light interference 202d may enter a volume 128 of the MEMS die 130 via top port hole 902. Based on the size, shape, and position of the light mitigation structure 502, light energy may not reflect or otherwise propagate in the direction of components of concern, such as ASIC 120. It will be understood that port hole 902 may be any suitable shape and dimensions less than the size of the light mitigation structure 502 to allow signals to enter the port hole 902 while limiting propagation of light or reflected light energy. In embodiments, sensor 900 may be a top port microphone, although a similar top port and light mitigation structure may be utilized with other sensor types such as a pressure (e.g., as depicted in FIG. 9B) or ultrasonic sensor.

Figure 9B:
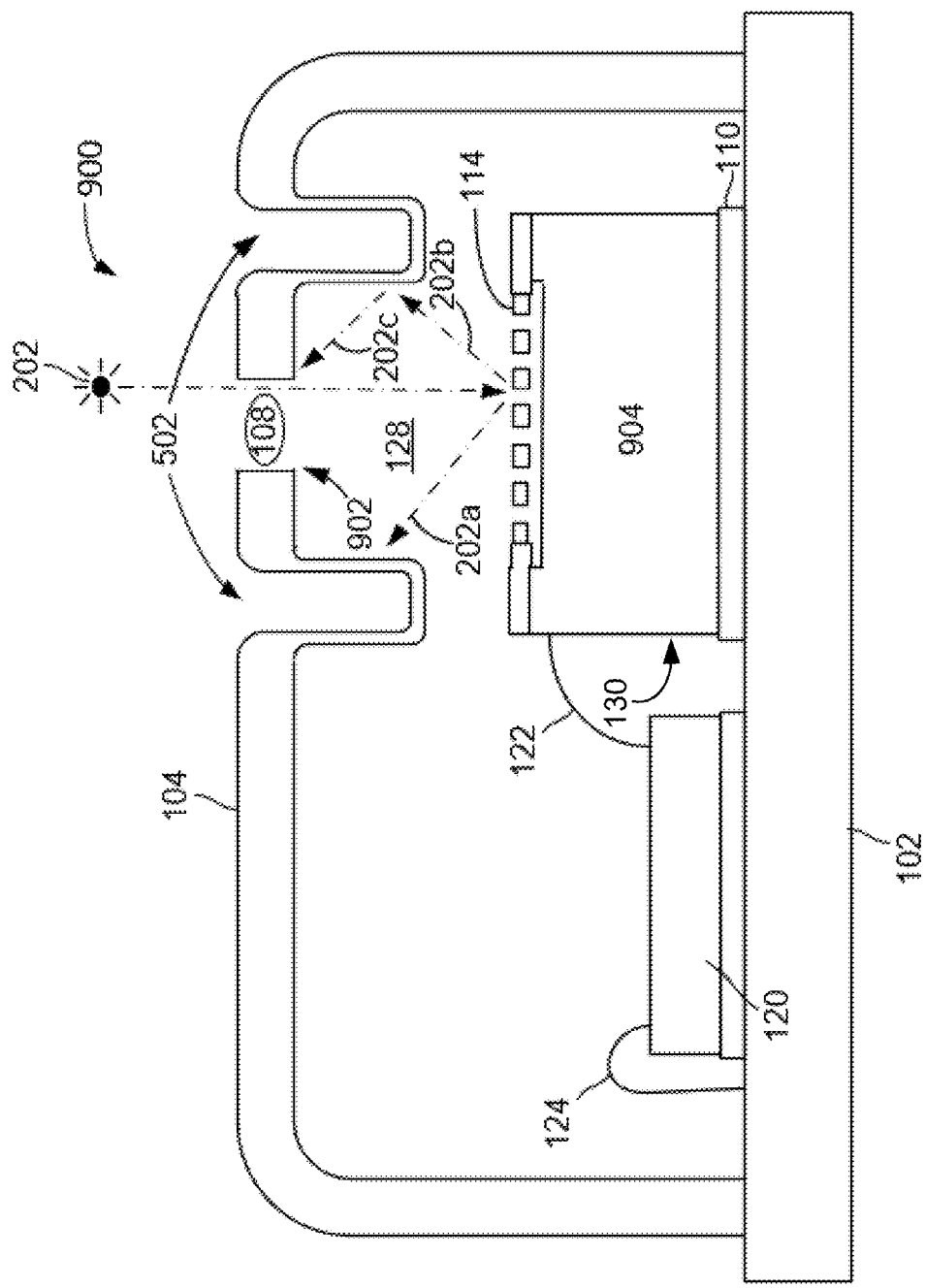
FIG. 9B shows an illustrative MEMS sensor package with a top port hole in accordance with an embodiment of the present disclosure.

FIG. 9B shows an illustrative MEMS sensor package with a top port hole in accordance with an embodiment of the present disclosure. Certain components of the MEMS sensor package 900 of FIG. 9A are depicted in MEMS sensor package 900 of FIG. 9B, except that a different MEMS sensor type (e.g., a MEMS pressure sensor) is depicted in FIG. 9B. The MEMS pressure sensor die of FIG. 9B comprises a MEMS layer 904 and a MEMS diaphragm 114 that is exposed to an external air pressure 108 via top port hole 902. Although an exemplary pressure sensor is depicted in FIG. 9B, it will be understood that other sensors exposed to external environments (e.g., ultrasonic, etc.) may also include such port holes with light mitigation structures. As in FIG. 9A, based on the size and position of the light mitigation structure 502 of FIG. 9B, light energy may not reflect or otherwise propagate in the direction of components of concern, such as ASIC 120.

Figure 10A:
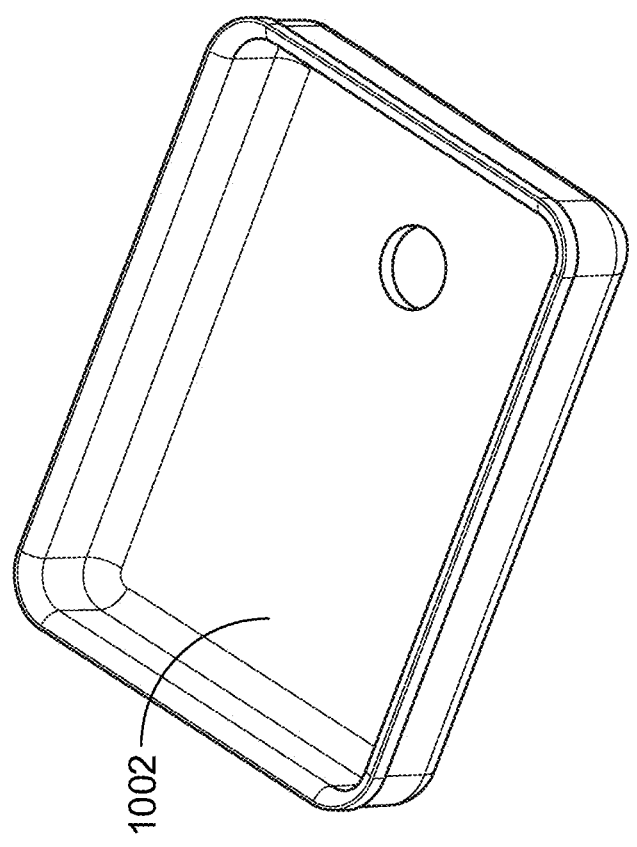
FIG. 10A shows a top perspective view of an external lid design with a port hole for a MEMS sensor package in accordance with an embodiment of the present disclosure.
Figure 10B:
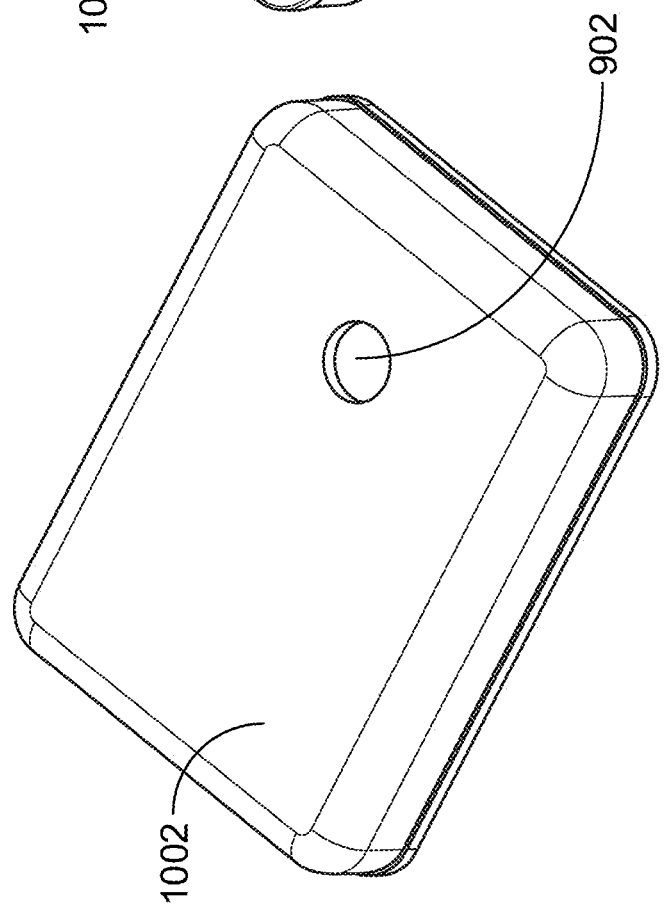
FIG. 10B shows a bottom perspective view of an external lid design with a port hole for a MEMS sensor package in accordance with an embodiment of the present disclosure.

FIG. 10A shows a top perspective view of an external lid design with a port hole for a MEMS sensor package in accordance with an embodiment of the present disclosure, while FIG. 10B shows a bottom perspective view of an external lid design with a port hole for a MEMS sensor package in accordance with an embodiment of the present disclosure. In the depicted embodiment, external lid 1002 encapsulates and attaches to an internal lid insert shown in FIG. 11A and FIG. 11B. External lid 1002 contributes to defining a back volume, which impacts acoustic performance (e.g., sensitivity and frequency response). External lid 1002 couples to a substrate of the sensor and surrounds components of the MEMS sensor package (e.g., ASIC, MEMS die, etc.), protecting the MEMS sensor components from external hazards (e.g., air, humidity, light, etc.), including RF interference. In some embodiments, external lid 1002 may include processing circuitry and may connect to external circuitry. External lid 1002 includes port hole 902, which is positioned above the light mitigation structure and above the MEMS diaphragm. Port hole 902 opens the lid so that light interference can escape. In some embodiments, port hole 902 may be any suitable shape (e.g., circular, rectangular, etc.) to allow light interference to escape. It will be understood that port hole 902 may be any suitable length or diameter less than the length or diameter of an associated light mitigation structure of an insert to allow light interference to escape.

Figure 11B:
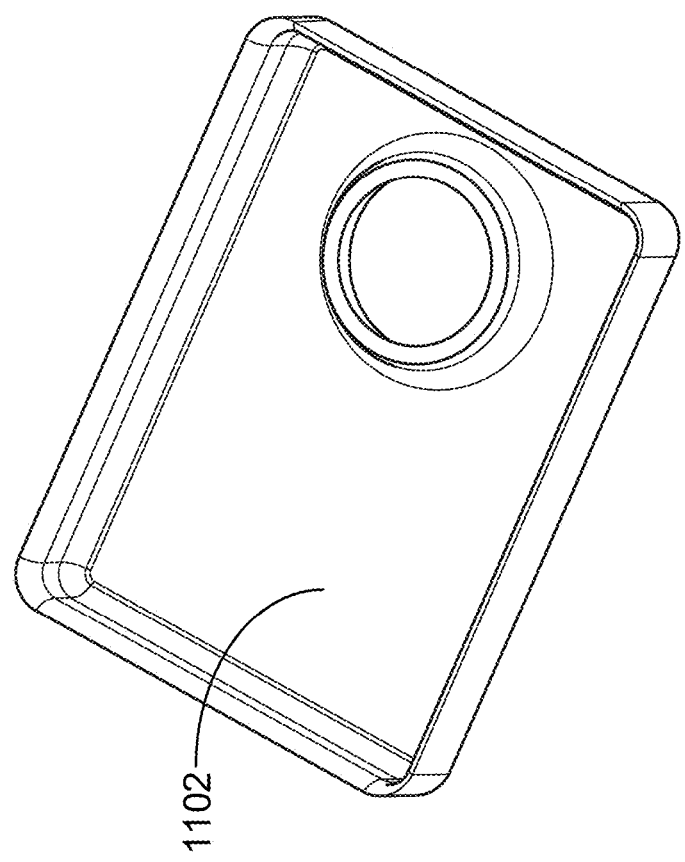
FIG. 11B shows a bottom perspective view of an internal lid insert design for a MEMS sensor package in accordance with an embodiment of the present disclosure.
Figure 11A:
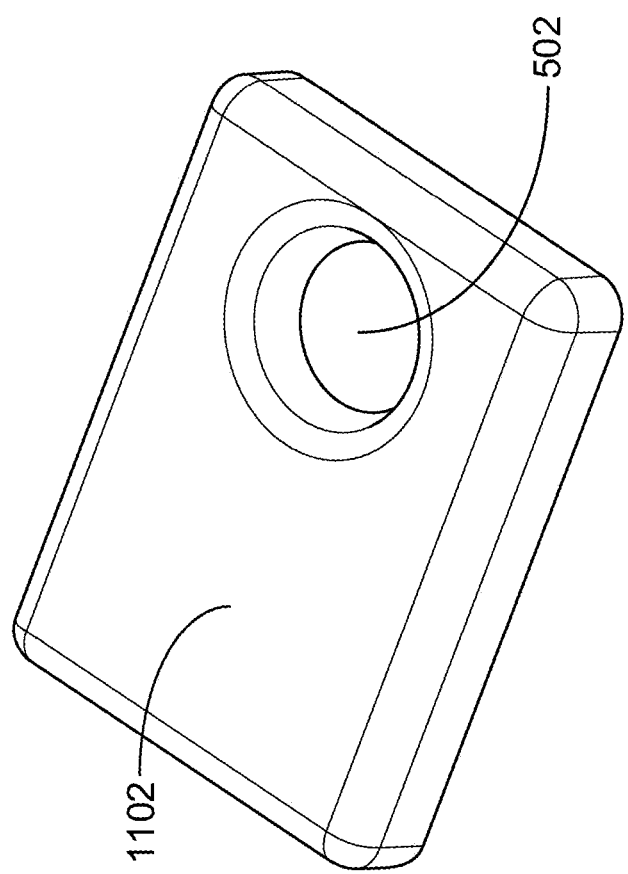
FIG. 11A shows a top perspective view of an internal lid insert design for a MEMS sensor package in accordance with an embodiment of the present disclosure.

FIG. 11A shows a top perspective view of an internal lid insert design for a MEMS sensor package in accordance with an embodiment of the present disclosure, while FIG. 11B shows a bottom perspective view of an internal lid insert design for a MEMS sensor package in accordance with an embodiment of the present disclosure. In the depicted embodiment, internal lid insert 1102 is enclosed by external lid 1002 depicted in FIG. 10A and FIG. 10B. Internal lid insert 1102 contributes to defining the back volume, which impacts acoustic performance (e.g., sensitivity and frequency response). Although internal lid insert 1102 may be a variety of materials having desired properties (e.g., light absorbing, reflective, etc.), or a combination of materials, in an embodiment the insert may be a light absorbing polymer. In the inset depicted in FIGS. 11A and 11B, light mitigation structure 502 of a cylindrical shape has been embedded in internal lid insert 1102 to prevent light interference from propagating throughout the back volume and impacting or damaging processing circuitry (e.g., ASIC). It will be understood that light mitigation structure 502 may be any suitable shape (e.g., cylindrical, rectangular, etc.) for mitigating light interference. Light mitigation structure 502 includes one or more features that extend from the upper surface of internal lid insert 1102 in the direction of the MEMS diaphragm and back plate.

Figure 12C:
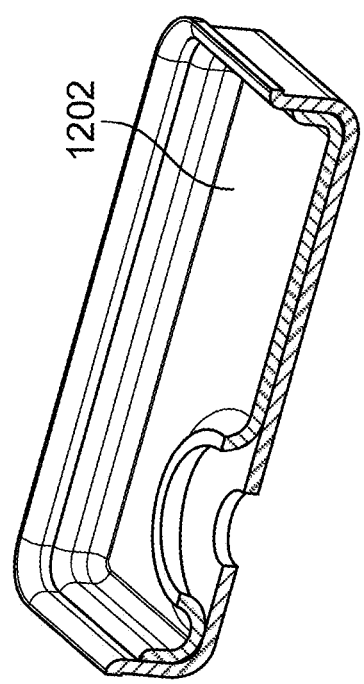
FIG. 12C shows a bottom perspective section view of a final lid assembly with a port hole for a MEMS sensor package in accordance with an embodiment of the present disclosure.
Figure 12A:
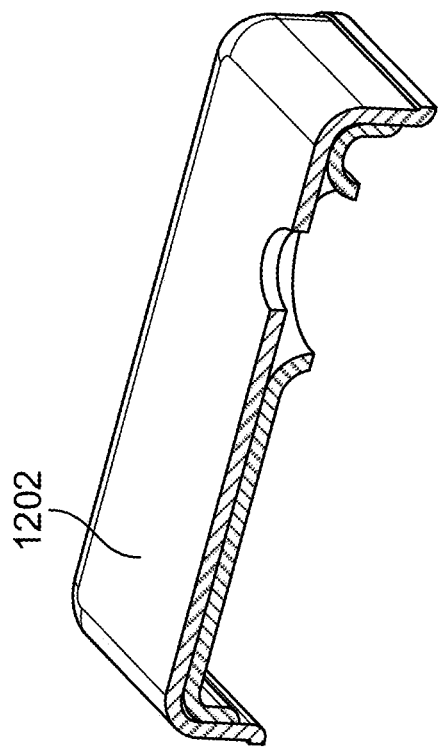
FIG. 12A shows a top perspective section view of a final lid assembly with a port hole for a MEMS sensor package in accordance with an embodiment of the present disclosure.
Figure 12B:
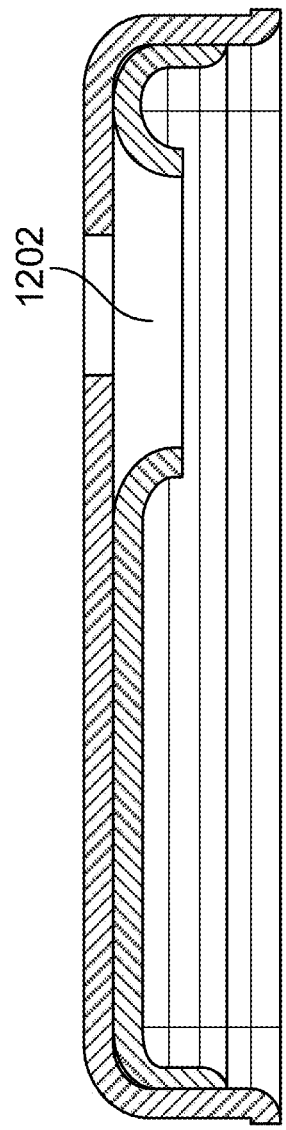
FIG. 12B shows a section view of a final lid assembly with a port hole for a MEMS sensor package in accordance with an embodiment of the present disclosure.

FIG. 12A shows a top perspective section view of a final lid assembly with a port hole for a MEMS sensor package in accordance with an embodiment of the present disclosure, FIG. 12B shows a section view of a final lid assembly with a port hole for a MEMS sensor package in accordance with an embodiment of the present disclosure, and FIG. 12C shows a bottom perspective section view of a final lid assembly with a port hole for a MEMS sensor package in accordance with an embodiment of the present disclosure. In the depicted embodiment, final lid assembly 1202 includes external lid 1002 and internal lid insert 1102 assemblies. Final lid assembly 1202 defines the back volume, which impacts acoustic performance (e.g., sensitivity and frequency response). In some embodiments, final lid assembly 1202 may include processing circuitry and may connect to external circuitry. Final lid assembly 1202 couples to a sensor substrate and surrounds components of the MEMS sensor package (e.g., ASIC, MEMS die, etc.), protecting them from external hazards (e.g., air, humidity, light, etc.), including RF interference. Final lid assembly 1202 includes a port hole, which is positioned on the upper surface of light mitigation structure above a MEMS diaphragm. The port hole allows light interference to escape the MEMS sensor package without impacting or damaging processing circuitry (e.g., ASIC).

FIG. 13A shows a top perspective view of a lid design for a MEMS sensor package in accordance with an embodiment of the present disclosure, FIG. 13B shows a section view of a lid design for a MEMS sensor package in accordance with an embodiment of the present disclosure, and FIG. 13C shows a bottom perspective view of a lid design for a MEMS sensor package in accordance with an embodiment of the present disclosure. In the depicted embodiment, light mitigation structure 1302 of a rectangular shape has been embedded in a lid to prevent light interference from propagating throughout the sensor's back volume and impacting or damaging processing circuitry (e.g., ASIC). Light mitigation structure 1302 is created, for example, with a deep drawing manufacturing process by modifying a stamping tool, including light cave roughness definition. Light mitigation structure 1302 includes a cavity surface detail (e.g., applied surface roughness, cave roughness) that is embedded in the upper inner surface of the lid and absorbs light interference that makes contact with the upper inner surface. In some embodiments, the cavity surface detail (e.g., applied surface roughness, cave roughness) may vary based on the stamping tool used to create light mitigation structure 1302.

The foregoing is merely illustrative of the principles of this disclosure and various modifications may be made by those skilled in the art without departing from the scope of this disclosure. The embodiments described herein are provided for purposes of illustration and not of limitation. Thus, this disclosure is not limited to the explicitly disclosed systems, devices, apparatuses, components, and methods, and instead includes variations to and modifications thereof, which are within the spirit of the attached claims.

The systems, devices, apparatuses, components, and methods described herein may be modified or varied to optimize the systems, devices, apparatuses, components, and methods. Although the present disclosure has been described with respect to an exemplary sensor such as a MEMS microphone, it will be understood that the inventions described in the present disclosure will apply equally to any sensor that may be exposed to light energy within a volume, such as pressure sensors, ultrasonic sensors, time-of-flight sensors, and the like.

What is claimed is:

1. A microelectromechanical system (MEMS) sensor package, comprising:
   a substrate including a through-hole;
   a MEMS die comprising a movable MEMS component movable in response to a signal received via the through-hole; and
   a lid coupled to the substrate and surrounding the MEMS die, wherein the lid comprises a light mitigation structure located above and facing the movable MEMS component, wherein a portion of the light mitigation structure has applied surface roughening.

2. The MEMS sensor package of claim 1, wherein the lid comprises an upper surface parallel to and facing the movable MEMS component and one or more side portions that extend from the substrate to the upper surface, and wherein the light mitigation structure is located on the upper surface.

3. The MEMS sensor package of claim 2, wherein the light mitigation structure comprises one or more features that extend from the upper surface in a direction of the movable MEMS component.

4. The MEMS sensor package of claim 3, wherein the movable MEMS component defines a first surface area, and wherein a second surface area of a portion of the lid upper surface located between the one or more features is greater than the movable MEMS component surface area such that the second surface area surrounds a projection of the first surface area.

5. The MEMS sensor package of claim 3, wherein the movable MEMS component defines a first shape, and wherein a second shape of a portion of the lid upper surface located between the one or more features is larger than the first shape such that the second shape surrounds a projection of the first shape to the lid upper surface.

6. The MEMS sensor package of claim 3, wherein the light mitigation structure comprises a cylindrical or rectangular extension from the upper surface of the lid.

7. The MEMS sensor package of claim 3, wherein a portion of the upper surface above the movable MEMS component comprises a reflective surface, and wherein the one or more features are less reflective than the portion of the upper surface.

8. The MEMS sensor package of claim 3, further comprising a light absorbing insert located on the upper surface between the one or more features.

9. The MEMS sensor package of claim 1, wherein the movable MEMS component has any one of a circular, square, hexagonal or octagonal shape.

10. The MEMS sensor package of claim 1, wherein the light mitigation structure comprises a light mitigation insert attached to the lid.

11. The MEMS sensor package of claim 1, further comprising processing circuitry enclosed by the lid, wherein the light mitigation structure directs light received via the movable MEMS component away from a direction of the processing circuitry.

12. The MEMS sensor package of claim 11, wherein the processing circuitry comprises an application specific integrated circuit ("ASIC"), and wherein the ASIC is located on the substrate adjacent to the MEMS die.

13. The MEMS sensor package of claim 12, further comprising:
one or more first wires extending between the MEMS die to the ASIC;
one or more second wires extending between the ASIC and the substrate; and
a plurality of coating spots located on an outer surface of the ASIC at respective locations where each of the one or more first wires and the one or more second wires contact the ASIC, wherein the ASIC does not include additional coating on the outer surface of the ASIC.

14. The MEMS sensor package of claim 11, wherein the processing circuitry comprises an application specific integrated circuit ("ASIC"), and wherein the ASIC is located within the substrate.

15. The MEMS sensor package of claim 1, wherein the MEMS sensor comprises a MEMS microphone, wherein an inner surface of the MEMS die defines a front volume in fluid communication with the through-hole, wherein the lid and an outer surface of the MEMS die define a back volume, and wherein the light mitigation structure extends into the back volume from an upper surface of the lid.

16. The MEMS sensor package of claim 1, wherein the MEMS sensor comprises a pressure sensor, time-of-flight sensor, or an ultrasonic sensor.

17. The MEMS sensor package of claim 1, further comprising an insert with circular or rectangular cut outs.

18. The MEMS sensor package of claim 1, wherein the MEMS die comprises a MEMS microphone, the signal comprises an acoustic signal, and the movable MEMS component comprises a MEMS diaphragm of the MEMS microphone.

19. A microelectromechanical system (MEMS) microphone, comprising:
a substrate including a through-hole,
a MEMS die located above the through hole and comprising a MEMS diaphragm movable in response to an acoustic signal received via the through-hole; and
a lid coupled to the substrate and surrounding the MEMS die, wherein the lid comprises a light mitigation structure located above and facing the MEMS diaphragm, wherein a portion of the light mitigation structure has applied surface roughening.

20. The MEMS microphone of claim 19, wherein the light mitigation structure comprises one or more features that extend from the lid in the direction of the MEMS diaphragm.

21. The MEMS microphone of claim 20, wherein the MEMS diaphragm defines a first surface area, and wherein a second surface area of a portion of the lid located between the one or more features is greater than the first surface area such that the second surface area surrounds a projection of the first surface area to the lid.

22. The MEMS microphone of claim 19, further comprising processing circuitry enclosed by the lid, wherein the light mitigation structure directs light received via the MEMS diaphragm away from a direction of the processing circuitry.

23. The MEMS microphone of claim 22, wherein the processing circuitry comprises an application specific integrated circuit ("ASIC"), and wherein the ASIC is located on the substrate adjacent to the MEMS die.

24. A method of manufacturing a light-mitigating lid for a microelectromechanical system (MEMS) sensor, comprising:
providing a lid that defines a volume around the MEMS sensor and includes a light mitigation structure;
applying surface roughening to a portion of the light mitigation structure; and
attaching the lid to a substrate such that the portion of the light mitigation structure having the surface roughening is located above and faces a movable MEMS component of the MEMS sensor.

25. The method of claim 24, further comprising producing, on the light mitigation structure, one or more features that extend from the lid in the direction of the movable MEMS component.

26. The method of claim 25, wherein the movable MEMS component defines a first surface area, and wherein a second surface area of a portion of the lid located between the one or more features is greater than the first surface area such that the second surface area surrounds a projection of the first surface area to the lid.

27. The method of claim 24, further comprising attaching processing circuitry to the substrate, wherein the processing circuitry is enclosed by the lid when the lid is attached to the substrate, and wherein the light mitigation structure directs light received via the movable MEMS component away from a direction of the processing circuitry.

28. The method of claim 27, wherein the processing circuitry comprises an application specific integrated circuit ("ASIC"), and wherein the ASIC is attached to the substrate adjacent to the MEMS die.

* * * * *